(12) United States Patent
Haider

(10) Patent No.: US 11,536,616 B2
(45) Date of Patent: Dec. 27, 2022

(54) SENSOR DEVICE AND METHOD FOR OPERATING A SENSOR DEVICE

(71) Applicant: E+E Elektronik Ges.m.b.H., Engerwitzdorf (AT)

(72) Inventor: Albin Haider, Alberndorf (AT)

(73) Assignee: E+E ELEKTRONIK GES.M.B.H., Engerwitzdorf (AT)

( * ) Notice: Subject to any disclaimer, the term of this patent is extended or adjusted under 35 U.S.C. 154(b) by 476 days.

(21) Appl. No.: 16/784,269

(22) Filed: Feb. 7, 2020

(65) Prior Publication Data
US 2020/0264121 A1 Aug. 20, 2020

(30) Foreign Application Priority Data
Feb. 14, 2019 (EP) ..................................... 19157089

(51) Int. Cl.
| | |
|---|---|
| G01K 7/25 | (2006.01) |
| G01K 7/00 | (2006.01) |
| H03M 1/66 | (2006.01) |
| G01D 18/00 | (2006.01) |
| G01D 3/02 | (2006.01) |
| G01D 21/02 | (2006.01) |

(52) U.S. Cl.
CPC ............... *G01K 7/25* (2013.01); *G01D 3/022* (2013.01); *G01D 18/00* (2013.01); *G01D 18/008* (2013.01); *G01D 21/02* (2013.01); *G01K 7/00* (2013.01); *H03M 1/66* (2013.01)

(58) Field of Classification Search
CPC ............ G01K 7/25; G01K 7/00; G01D 3/022; G01D 18/00; G01D 18/008; G01D 21/02; G01D 3/0365; H03M 1/66
See application file for complete search history.

(56) References Cited

U.S. PATENT DOCUMENTS

| | | | | |
|---|---|---|---|---|
| 5,144,814 A | * | 9/1992 | Gaudette | .................. G01B 7/16 |
| | | | | 374/3 |
| 5,347,476 A | * | 9/1994 | McBean, Sr. | .......... G01D 3/022 |
| | | | | 73/1.88 |
| 6,074,089 A | | 6/2000 | Hollander et al. | |

(Continued)

FOREIGN PATENT DOCUMENTS

| | | |
|---|---|---|
| EP | 3279613 A1 | 2/2018 |
| GB | 2321712 A | 8/1998 |

*Primary Examiner* — Natalie Huls
*Assistant Examiner* — Cynthia L Davis
(74) *Attorney, Agent, or Firm* — Leydig, Voit & Mayer, Ltd.

(57) ABSTRACT

A sensor device includes at least one sensor, a digital signal processor and an amplifier. The at least one sensor is configured to measure a variable physical quantity and provide a raw sensor signal at an output of the at least one sensor. The digital signal processor is configured to preprocess the raw sensor signal output by the at least one sensor into a sensor signal and to further process the sensor signal into a pulse-width-modulated output signal having a duty cycle that is dependent on the measured quantity using a plurality of device-specific correction parameters stored in a memory to convert the sensor signal into the pulse-width modulated output signal. The amplifier is configured to convert the pulse-width modulated output signal into an analog voltage or current signal.

13 Claims, 4 Drawing Sheets

(56) References Cited

U.S. PATENT DOCUMENTS

| | | | |
|---|---|---|---|
| 6,249,753 B1* | 6/2001 | Mason | G01D 3/022 |
| | | | 702/104 |
| 7,731,417 B2 | 6/2010 | Kumagai | |
| 2013/0266041 A1* | 10/2013 | Giri | G01K 7/25 |
| | | | 374/171 |
| 2014/0019816 A1 | 1/2014 | Hamanaka | |
| 2014/0278144 A1* | 9/2014 | Risk | G01D 18/008 |
| | | | 702/24 |
| 2018/0038714 A1 | 2/2018 | Sloat et al. | |

* cited by examiner

SENSOR DEVICE AND METHOD FOR OPERATING A SENSOR DEVICE

CROSS-REFERENCE TO PRIOR APPLICATION

Priority is claimed to European Patent Application No. EP 19157089.4, filed on Feb. 14, 2019, the entire disclosure of which is hereby incorporated by reference herein.

FIELD

The present invention relates to a sensor device for measuring variable physical quantities and to a method for operating such a sensor device.

BACKGROUND

In order to measure variable physical quantities, such as temperature and humidity, there are known sensor devices which output the respective measured quantities via a signal-processing unit as pulse-width modulated (PWM) signals after suitable preprocessing and further processing. The measured quantity is contained in the generated PWM signal and encoded therein by way of the duty cycle p of the PWM signal. The duty cycle p is understood to be the ratio of the duration $t_H$ of a HIGH level to the signal period duration $t_P=t_H+t_L$ in the rectangular PWM signal; i.e., $p=t_H/t_P$, with $t_L$ denoting the duration of a LOW level in the PWM signal. For further processing of the PWM signal, the PWM signal having the measured-quantity-dependent duty cycle p is typically demodulated and amplified by an amplifier unit and thus converted into an analog current or voltage signal within a certain current or voltage range. For example, in the case of a current signal, a current range between 4 mA and 20 mA, and, in the case of a voltage signal, a voltage range between 0 V and 10 V are typical ranges for the analog output signal. However, in practice, the electronic components used both in the signal-processing unit and in the amplifier unit are subject to variations, which may result, for example, in varying voltages of the PWM signal, varying offset voltages of operational amplifiers or varying resistance tolerances of amplifier stages. The result is that even if the quantities measured are identical, the measurement values output by the sensor device in the form of the analog current or voltage signals vary unacceptably from sensor device to sensor device, thus impairing the desired measurement accuracy.

In order to overcome such problems in the case of temperature measurement, U.S. Pat. No. 7,731,417 B2 describes making a temperature measurement at a known reference temperature in an adjustment mode preceding the measurement mode. During this process, several correction values are determined and stored in a memory. In the measurement mode, the correction values are then used to correct the pulse width of the PWM signal as a function of temperature. In the proposed approach, the PWM signal is generated via analog signal-processing components to which are fed the correction values from the memory. For this purpose, complex D/A converters are required to convert the stored digital correction values into suitable analog signals. The higher the requirements on the accuracy of the PWM signal, the higher will consequently be the requirements on the resolution of the D/A converters. Thus, if a higher resolution is desired, the complexity of the circuitry increases significantly.

SUMMARY

In an embodiment, the present invention provides a sensor device including at least one sensor, a digital signal processor and an amplifier. The at least one sensor is configured to measure a variable physical quantity and provide a raw sensor signal at an output of the at least one sensor. The digital signal processor is configured to preprocess the raw sensor signal output by the at least one sensor into a sensor signal and to further process the sensor signal into a pulse-width-modulated output signal having a duty cycle that is dependent on the measured quantity using a plurality of device-specific correction parameters stored in a memory to convert the sensor signal into the pulse-width modulated output signal. The amplifier is configured to convert the pulse-width modulated output signal into an analog voltage or current signal.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1:
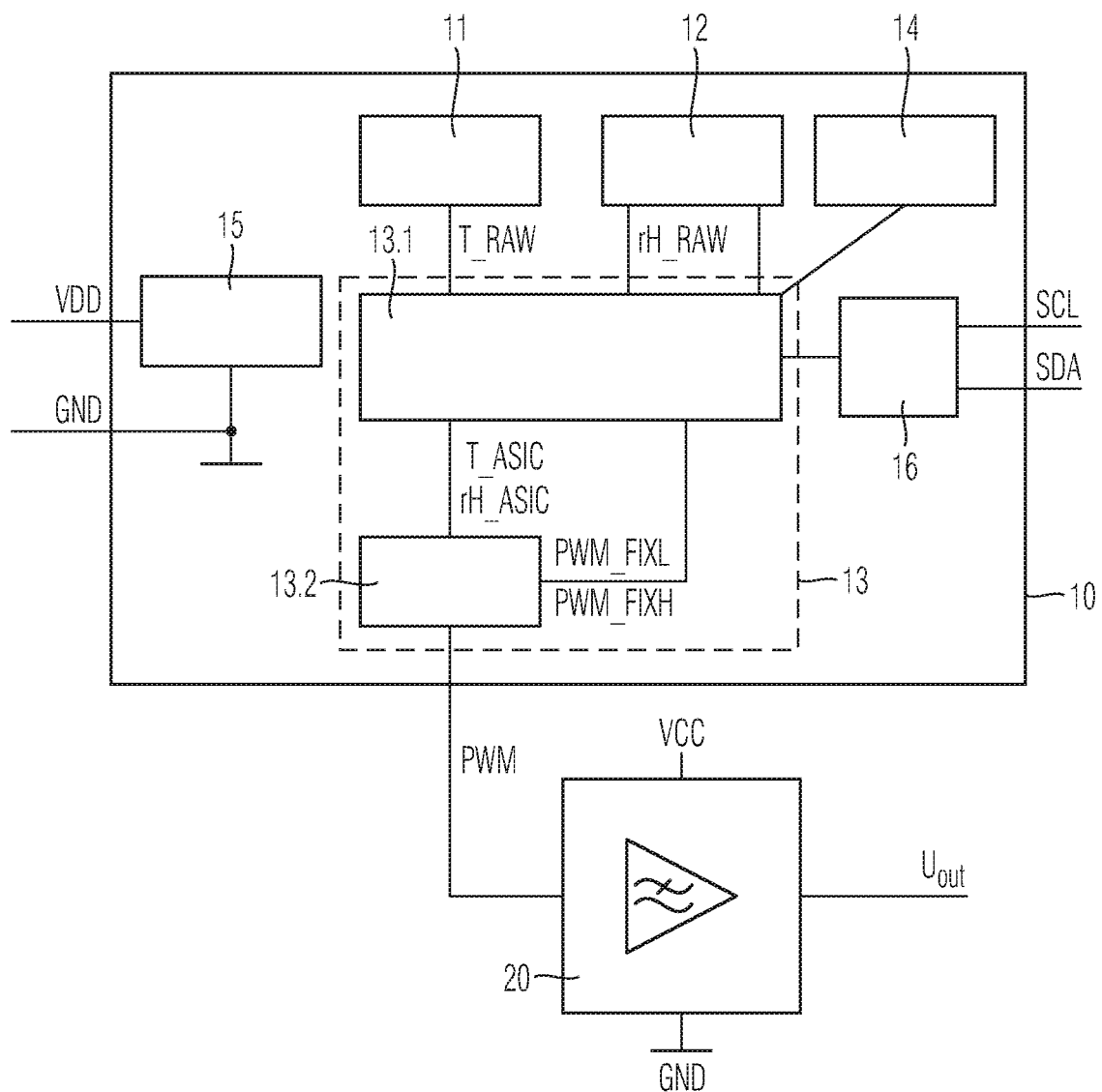
FIG. 1 is a highly schematic block diagram of a first exemplary embodiment of the sensor device according to the present invention.

In an embodiment, the present invention provides a sensor device for measuring variable physical quantities that enables analog current or voltage signals relating to the measured physical quantities to be output with high accuracy and reliability and with the least possible circuit complexity.

In another embodiment, the present invention provides a method for operating a sensor device for measuring variable physical quantities that enables analog current or voltage signals relating to the measured physical quantities to be output with high accuracy and reliability.

The sensor device according to an embodiment of the present invention includes:
- at least one sensor which measures variable physical quantities and provides a raw sensor signal at its output,
- a digital signal-processing unit for preprocessing the raw sensor signal provided by the sensor into a sensor signal, the signal-processing unit further processing the sensor signal thereby converting it into a pulse-width-modulated output signal whose duty cycle is dependent on the measured quantity, for which purpose a plurality of device-specific correction parameters are stored in a memory unit, which are used by the signal-processing unit to convert the sensor signal into the pulse-width modulated output signal, and an amplifier unit which converts the pulse-width modulated output signal into an analog voltage or current signal.

Advantageously, the digital signal-processing unit has stored therein a device-specific conversion rule which describes a linear relationship between the measurement value of the sensor signal and a duty cycle parameter of the pulse-width modulated output signal.

In this connection, at least a minimum duty cycle parameter threshold and a maximum duty cycle parameter threshold may be stored as device-specific correction parameters in the memory unit.

Furthermore, the memory unit may additionally have stored therein a minimum sensor threshold measurement value and a maximum sensor threshold measurement value, which limit the measurement range of the sensor.

The relationship:

$$\text{PWM\_OUT\_NOW} = \text{MV\_NOW} \cdot k_{PWM} + d_{PWM}$$

may be stored as a device-specific conversion rule in the digital signal-processing unit, where
PWM_OUT_NOW:=duty cycle parameter of the PWM signal
MV_NOW:=value measured by the sensor $$k_{PWM} := \frac{(\text{PWM\_OUT\_MAX} - \text{PWM\_OUT\_MIN})}{(\text{MW\_OUT\_MAX} - \text{MV\_OUT\_MIN})}$$

$d_{PWM}$:=PWM_OUT_MIN−MV_OUT_MIN·$k_{PWM}$
PWM_OUT_MAX:=maximum duty cycle parameter threshold
PWM_OUT_MIN:=minimum duty cycle parameter threshold
MV_OUT_MAX:=maximum sensor threshold measurement value
MV_OUT_MIN:=minimum sensor threshold measurement value It may be provided that the at least one sensor, the digital signal-processing unit and the memory unit be disposed together in an ASIC and that the amplifier unit be configured separately from the ASIC.

The memory unit may be configured as a non-volatile memory unit.

In a possible embodiment, the amplifier unit may be configured as an amplifier circuit with a low-pass filter.

Advantageously, two sensors are provided, of which a first sensor is configured as a temperature sensor and a second sensor is configured as a humidity sensor.

The method according to the present invention is used for operating a sensor device in a measurement mode and in a calibration mode.

In the measurement mode,
at least one sensor measures a variable physical quantity and provides a raw sensor signal at its output, and
a digital signal-processing unit preprocesses the raw sensor signal provided by the sensor into a sensor signal and converts the sensor signal into a pulse-width-modulated output signal whose duty cycle is dependent on the measured quantity, and
an amplifier unit converts the pulse-width modulated output signal into an analog voltage or current signal.
In a calibration mode preceding the measurement mode, a plurality of device-specific correction parameters are stored in a memory unit, which are used by the signal-processing unit in the measurement mode to convert the sensor signal into the pulse-width modulated output signal.

Preferably, in the calibration mode, a device-specific conversion rule which describes a linear relationship between the measurement value of the sensor signal and a duty cycle parameter of the pulse-width modulated output signal is stored in the digital signal-processing unit.

In this connection, at least a minimum duty cycle parameter threshold and a maximum duty cycle parameter threshold may be stored as device-specific correction parameters in the memory unit in the calibration mode.

Furthermore, a minimum sensor threshold measurement value and a maximum sensor threshold measurement value, which limit the measurement range of the sensor, may additionally be stored in the memory unit.

In a possible embodiment, the relationship $$\text{PWM\_OUT\_NOW} = \text{MV\_NOW} \cdot k_{PWM} + d_{PWM}$$

is stored as a device-specific conversion rule in the digital signal-processing unit, where
PWM_OUT_NOW:=duty cycle parameter of the PWM signal
MV_NOW:=measurement value of the sensor signal $$k_{PWM} := \frac{(\text{PWM\_OUT\_MAX} - \text{PWM\_OUT\_MIN})}{(\text{MW\_OUT\_MAX} - \text{MV\_OUT\_MIN})}$$

$d_{PWM}$:=PWM_OUT_MIN−MV_OUT_MIN·$k_{PWM}$
PWM_OUT_MAX:=maximum duty cycle parameter threshold
PWM_OUT_MIN:=minimum duty cycle parameter threshold
MV_OUT_MAX:=maximum sensor threshold measurement value
MV_OUT_MIN:=minimum sensor threshold measurement value Moreover, it is possible to perform the calibration mode without changing the temperature of the sensor device.

In the case that analog voltage or current signals are output, the measures according to the present invention now allow the respective measurement values to be reliably acquired with high accuracy. This is ensured even if individual components of the respective sensor device exhibit manufacturing-related component variations.

Furthermore, the measures according to the present invention make it possible to substantially reduce the circuit complexity required to provide the highly accurate analog current or voltage signals at the output. In particular, generating the PWM signal through digital signal processing, as provided for herein, eliminates the need for complex components, such as D/A converters.

The digital signal processing provided herein also makes it possible to extremely flexibly adjust the relationship between the respective quantity measured and the duty cycle of the PWM signal.

Other details and advantages of the present invention will be explained in the following description of exemplary embodiments of the inventive sensor device and the inventive method in conjunction with the figures.

An exemplary embodiment of the inventive sensor device for measuring variable physical quantities is shown in a highly schematic block diagram in FIG. 1.

The sensor device has, firstly, an integrated circuit in the form of an ASIC 10, which includes various analog and digital signal-processing components whose functions will be described in detail below. ASIC 10 is configured as a mixed-signal ASIC and is suitable for processing analog and digital signals.

Figure 3:
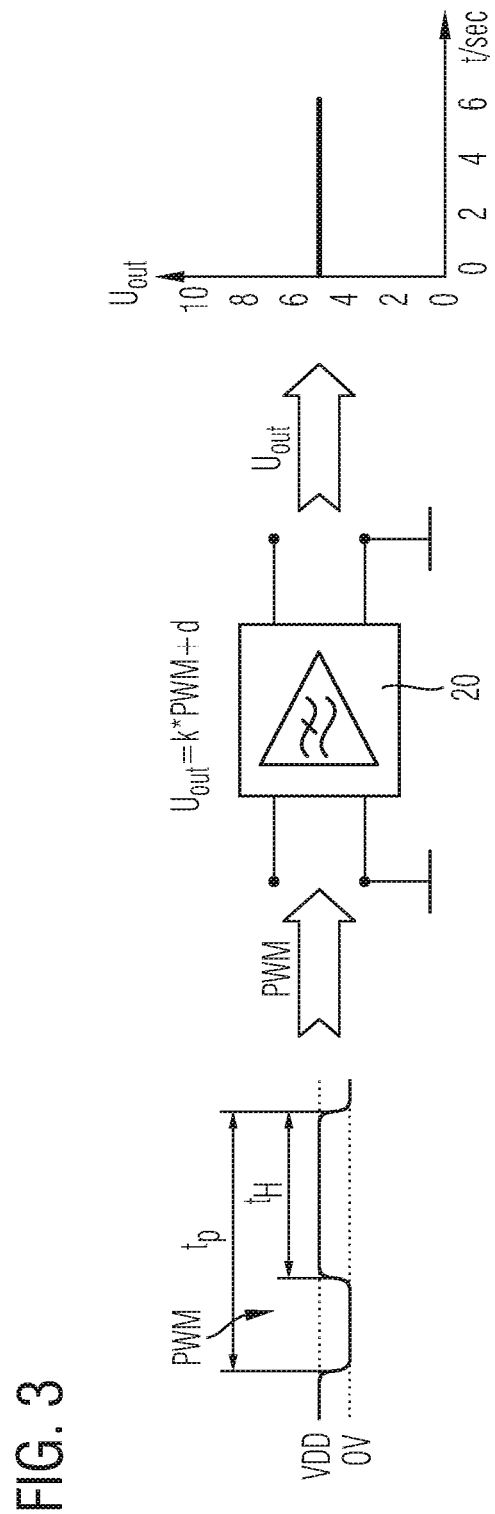
FIG. 3 is a schematic view illustrating the conversion of a PWM signal into an analog voltage signal.

Secondly, the sensor device according to the present invention includes an amplifier unit 20, which converts a PWM signal which is dependent on the quantity being measured and is supplied by ASIC 10 into an analog output signal. The present exemplary embodiment provides for conversion into an analog voltage signal $U_{OUT}$, as is also illustrated FIG. 3 in greater detail. FIG. 3 further shows that the PWM signal has a substantially rectangular waveform between a LOW level (0 V) and a HIGH level (VDD), the HIGH level corresponding to the supply voltage VDD of ASIC 10. The analog voltage signal $U_{OUT}$ generated in this way is then output to subsequent electronics for further processing. In a possible embodiment, amplifier unit 20 is configured as an amplifier circuit with a low-pass filter. The low-pass filter may be configured as a first or higher order low-pass filter. This means that, in addition to the filtering and conversion of PWM signal PWM, the resulting analog signal $U_{OUT}$ is suitably amplified via amplifier unit 20. For example, supply voltage VDD of ASIC 10 may be amplified from VDD=3.3 V to 10 V in the analog voltage signal $U_{OUT}$.

In the figure, reference numeral 15 denotes a low drop-out (LDO) voltage regulator, via which ASIC 10 is powered. LDO voltage regulator 15 reduces the external supply voltage to a voltage value that is suitable for the ASIC, e.g. to 1.8 V. In the present example, the sensor device according to the present invention outputs an analog voltage signal in the range between 0 V and 10 V to the subsequent electronics.

In the example shown, the variable physical quantities to be measured are the temperature T and the humidity rH. In order to measure the quantities T, rH, a first sensor 11 for measuring temperature and a second sensor 12 for measuring humidity are configured in the analog portion of ASIC 10. The sensor 11 for measuring temperature may include a transistor where a temperature-dependent base-emitter voltage is measured with the aid of an A/D converter and converted into a digital signal. The sensor 12 used for measuring humidity may be a parallel-plate capacitor whose humidity-dependent capacitance is measured by a capacitance measurement stage and converted into a digital signal. Thus, the sensors 11, 12 integrated in ASIC 10 provide at the output raw sensor signals T_RAW, rH_RAW relating to the respective quantities T, rH.

Raw sensor signals T_RAW, rH_RAW are digital data words, e.g., in the form of 16-bit data words, which are each fed by sensors 11, 12 to a downstream digital signal-processing unit 13 in ASIC 10. Digital signal-processing unit 13 is configured as a digital signal processor in ASIC 10 and is used, among other things, to preprocess and further process raw sensor signals T_RAW, rH_RAW into sensor signals T_ASIC, rH_ASIC. In accordance with the illustration of FIG. 1, digital signal-processing unit 13 includes at least two separate functional blocks 13.1, 13.2. It should be noted that this illustration has been selected merely to aid in providing below a more comprehensible description of the principle of the signal processing process in digital signal-processing unit 13, and should not be understood to be limiting with respect to the configuration of digital signal-processing unit 13.

In signal-processing unit 13; i.e., in the first functional block 13.1 thereof, raw sensor signals T_RAW, rH_RAW first undergo preprocessing. In this process, for example, a linearization may be performed to compensate for possibly existing non-linearities of sensors 11, 12. Furthermore, errors caused by variations in the manufacture of sensors 11, 12 may be corrected during preprocessing. It is also possible to compensate for temperature cross-sensitivities of the humidity sensor and for the self-heating of ASIC 10, etc. In connection with the preprocessing of raw sensor signals T_RAW, rH_RAW, it should be pointed out that the preprocessing can, in principle, be performed in many different ways and is not among the measures that are essential to the present invention.

The signals that are generated from raw sensor signals T_RAW, rH_RAW during preprocessing in first functional block 13.1 of digital signal-processing unit 13 are hereinafter referred to as sensor signals T_ASIC and rH_ASIC, respectively. In second functional block 13.2 of digital signal-processing unit 13, sensor signals T_ASIC, rH_ASIC are then further processed and converted into a pulse-width-modulated output signal PWM having a duty cycle p which is dependent on the respective measured quantity T, rH. As already explained above, duty cycle p is understood to be the ratio of the duration $t_H$ of a HIGH level (e.g., 3.3 V) to the signal period duration $t_P=t_H+t_L$ in the rectangular PWM signal; i.e., it holds that $p=t_H/t_P$, with $t_L$ denoting the duration of a LOW level (e.g. 0 V) in the PWM signal. In the case of a signal period duration $t_P$ defined by a fixed clock frequency, the duration $t_H$ is proportional to the value of the measured quantity T or rH. In the case of a PWM resolution of 16 bits, signal period duration $t_P$ can thus be divided into $2^{16}=65,536$ intervals or steps. This allows values of the measured quantity T, rH in the range between 0 (PWM signal continuously at the LOW level) and 65,535 (PWM signal almost continuously at the HIGH level) to be encoded by way of the duty cycle p of PWM signal PWM and to be output. In the following, the duration $t_H$ of the HIGH level will also be referred to as a duty cycle parameter or PWM value. The duty cycle parameter then uniquely characterizes the respective duty cycle p. Given a resolution of 16 bits, the duty cycle parameter can assume values in the range between 0 and 65,535.

In order to minimize the above-discussed problems with component variations, provision is made for the inventive sensor device to be operable in two different modes, namely in a measurement mode and in a calibration mode. In the measurement mode, the respective physical quantities T, rH are measured, the measured quantities are converted into a respective pulse-width-modulated output signal PWM, and PWM signal PWM is then converted into an analog voltage signal $U_{OUT}$ suitable for further processing. The calibration mode preceding the measurement mode is used to determine a plurality of device-specific correction parameters of the sensor device, which are stored in a memory unit 14 that is also integrated in ASIC 10. Memory unit 14 is preferably configured as a non-volatile memory unit, for example as an EEPROM. The calibration can generally be performed in different ways. For example, it may already be performed at the factory during the manufacture of the sensor device or later by the particular user. The specific correction parameters determined for each individual sensor device in the calibration mode are used in the measurement mode during signal processing in digital signal-processing unit 13 to generate a PWM signal PWM which has a device-specific duty cycle p and encodes the measured quantity. This makes it possible to account for possible component variations in different sensor devices and to thereby ensure correct provision of an output signal $U_{OUT}$ that is dependent on the quantity being measured.

In the following, the determination of the device-specific correction parameters and their use in the measurement mode are described by way of example for the quantity temperature T to further illustrate the inventive sensor device and the measurement and calibration modes provided for its operation. In the case of the quantity humidity rH or possible additional quantities to be measured, the procedure is generally completely analogous.

Figure 2A:
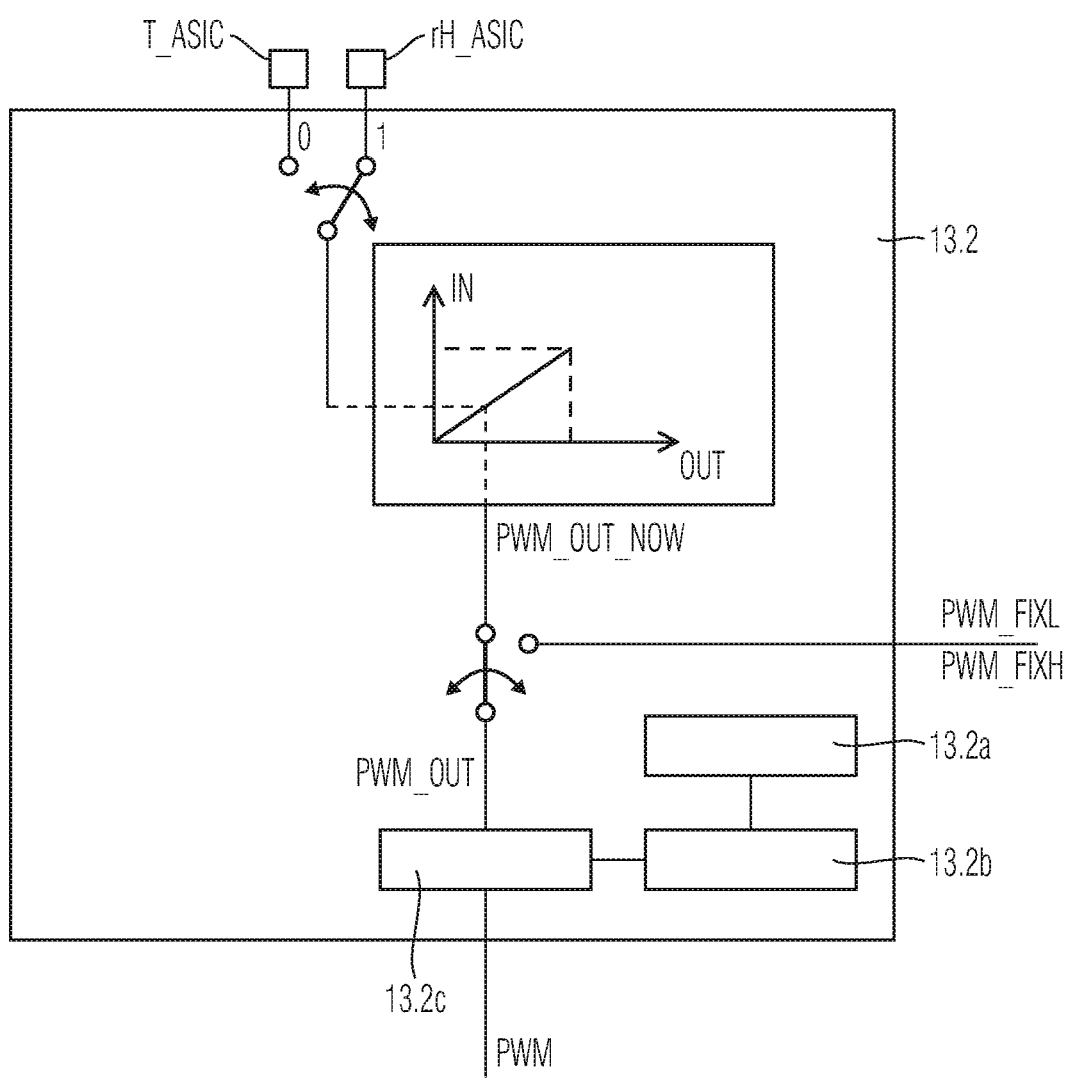
FIG. 2a is a schematic detail view showing a portion of the block diagram of FIG. 1 to illustrate the conversion of a PWM signal into an analog voltage signal.

In order to perform the calibration mode; i.e., to determine the device-specific correction parameters in the calibration mode, the ASIC 10 of the inventive sensor device includes an interface 16 configured, for example, as a known I2C interface. The sensor device or ASIC 10 is connected via interface 16 and corresponding signal transmission lines SCL, SCA to a downstream control unit, for example, via an I2C USB converter to a PC. Via interface 16, a PWM signal PWM having a fixed or specifically predefined duty cycle p, respectively a fixed, predefined duty cycle parameter or PWM value, can be caused to be output from ASIC 10 to amplifier unit 20. Specifically, a possible embodiment of the method according to the present invention provides for a first PWM signal having the duty cycle parameter or PWM value PWM_FIXL and a second PWM signal having the duty cycle parameter or PWM value PWM_FIXH to be output during the calibration mode. In FIG. 2*a*, which shows the second functional block 13.2 of digital signal-processing unit 13, the lower switch indicates the possibility of switching between the measurement mode and the calibration mode. In the calibration mode, the components 13.2*a*-13.2*c* will receive the duty cycle parameters PWM_FIXL, PWM_FIXH to generate corresponding PWM signals PWM, while in the measurement mode, they will receive the duty cycle parameter PWM_OUT_NOW relating to the current measurement value.

The term "PWM_MAX" is used hereinafter to refer to the maximum duty cycle parameter that can be output. Furthermore, it is assumed that the respective sensor device has a PWM resolution of 16 bits; i.e., possible duty cycle parameters or PWM values are in the range between 0 and 65,535; the supply voltage VDD for ASIC 10 is VDD=3.3 V.

As schematically indicated in FIG. 3, the respective PWM signal PWM having a defined PWM value PWM_OUT is converted by amplifier unit 20 into an analog voltage signal $U_{OUT}$ according to the following relationship:

$$U_{OUT}=k \cdot PWM\_OUT+d \quad \text{(equation 1a)}$$

or $$PWM\_OUT=(U_{OUT}-d)/d \quad \text{(equation 1b)}$$

where:
$U_{OUT}$:=value of the analog voltage signal
PWM_OUT:=duty cycle parameter or PWM value of the PWM signal
k:=amplification factor of the amplifier unit
d:=offset of the amplifier unit In the example, a possible temperature measurement in the range between −40° C. and +60° C. is to be scaled. This means that the minimum output temperature T_OUT_MIN is T_OUT_MIN=−40° C. and the maximum output temperature T_OUT_MAX is T_OUT_MAX=+60° C. A minimum analog voltage signal $U_{OUT}$ of OUT_MIN=0 V is to correspond to the minimum output temperature T_OUT_MIN, and a maximum analog voltage signal $U_{OUT}$ of OUT_MAX=10 V is to correspond to the maximum output temperature T_OUT_MAX.

First, in the calibration mode, ASIC 10 is caused, via interface 16, to output a first PWM signal having a lower, fixed duty cycle parameter value PWM_FIXL=10,000. For this preset, fixed PWM value, the value OUT_LOW of the analog output signal $U_{OUT}$ resulting downstream of amplifier unit 20 is then measured, yielding, for example, a value of OUT_LOW=0.573 V.

Then, a further, second PWM signal PWM having an upper, fixed duty cycle parameter value PWM_FIXH=50,000 is output, for which the measured analog output signal $U_{OUT}$ has the exemplary value of OUT_HIGH=9.573 V.

Based on this, the parameters k and d can then be determined from equation 1) for the specific sensor device to be calibrated, and thus the actual relationship between the duty cycle p or the associated PWM value PWM_OUT and the output value $U_{OUT}$ of analog signal $U_{OUT}$ can be determined in general and specifically for the illustrated example (equations 2a, 2b):

$$k = \frac{(OUT\_HIGH - OUT\_LOW)}{(PWM\_FIXH - PWM\_FIXL)} \quad \text{(equation 2a)}$$

$$= \frac{(9.573\ V - 0.573\ V)}{(50{,}000 - 10{,}000)}$$

$$= 0.000225\ \frac{V}{LSB}$$

$$d = OUT\_LOW - PWM\_FIXL \cdot k \quad \text{(equation 2b)}$$

$$= 0.573 - 10{,}000 \cdot 0.000225$$

$$= 1.677\ V$$

where:
k:=amplification factor of the amplifier unit
d:=offset of the amplifier unit
PWM_FIXL:=lower duty cycle parameter value
PWM_FIXH:=upper duty cycle parameter value
OUT_MIN:=value of the analog output signal $U_{OUT}$ at the minimum temperature
OUT_HIGH:=measured value of output signal $U_{out}$ at the upper duty cycle parameter value PWM_FIXH
OUT_LOW:=measured value of output signal $U_{out}$ at the lower duty cycle parameter value PWM_FIXL Amplifier unit 20 must generally be designed such that in each tolerance case, an associated PWM value will exist. This means that the PWM value to be output by ASIC 10 must always be between PWM_OUT=0 and PWM_OUT=PWM_MAX.

Figure 2B:
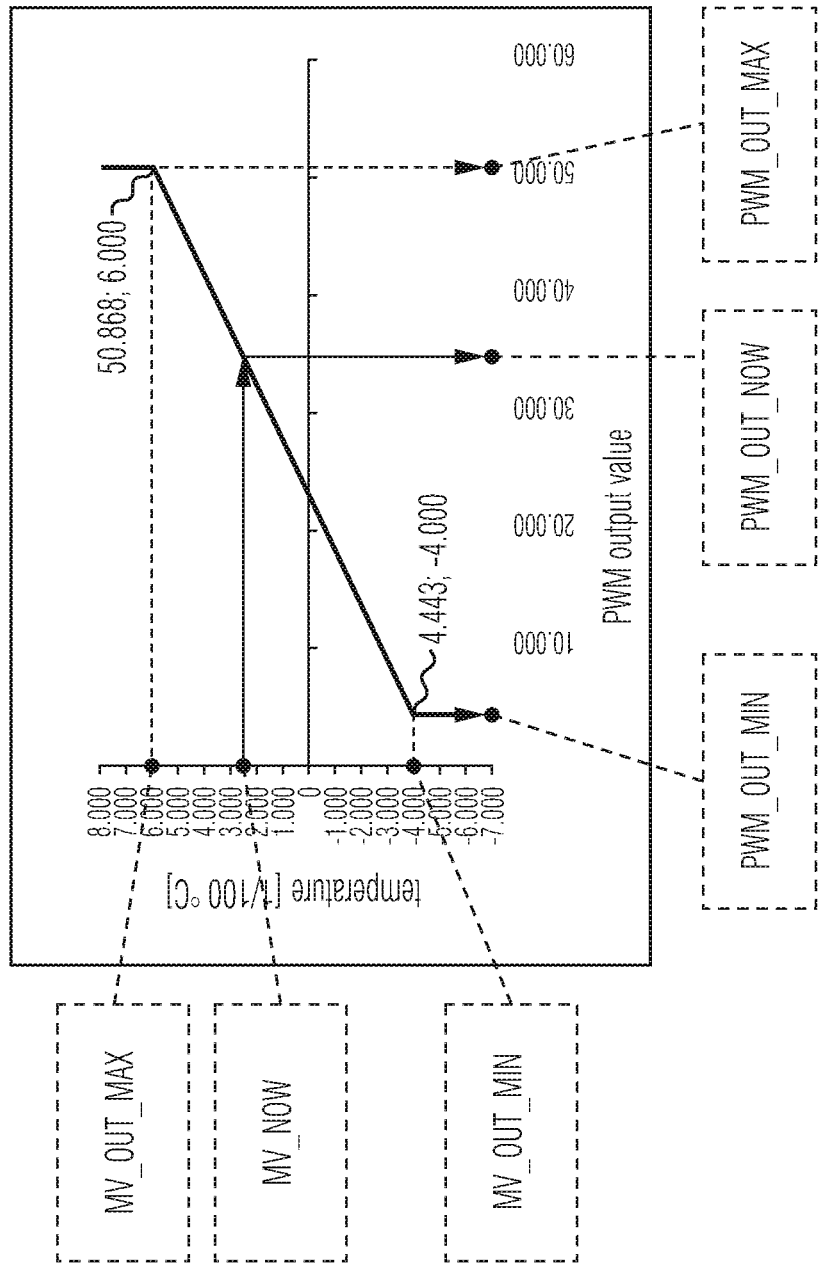
FIG. 2b is another schematic view illustrating the conversion of a PWM signal into an analog voltage signal through linear interpolation.

With this, the PWM values PWM_OUT_MIN and PWM_OUT_MAX required to output, via amplifier unit 20, exactly the values OUT_MIN=0 V and OUT_MAX=10 V for the analog voltage signal $U_{OUT}$ can now be individually determined for the sensor device being calibrated. The respective PWM values PWM_OUT_MIN and PWM_OUT_MAX are derived in general from equation 1b) and for the specific example being discussed as follows:

$$PWM\_OUT\_MIN = \frac{OUT\_MIN - d}{k} \quad \text{(equation 3a)}$$

$$= \frac{0\ V + 1.667}{0.000225}$$

$$= 7{,}453$$

$$PWM\_OUT\_MAX = \frac{OUT\_MAX - d}{k} \quad \text{(equation 3b)}$$

$$= \frac{(10{,}000\ V + 1.677\ V)}{0.000225}$$

$$= 51{,}898$$

where:
PWM_OUT_MIN:=PWM value required to output OUT_MIN=0 V in the analog voltage signal $U_{OUT}$ PWM_OUT_MAX:=PWM value required to output OUT_MAX=10 V in the analog voltage signal $U_{OUT}$
k:=amplification factor of the amplifier unit
d:=offset of the amplifier unit
OUT_MIN:=value of the analog output signal $U_{OUT}$ at the minimum temperature
OUT_MAX:=value of the analog output signal $U_{OUT}$ at the maximum temperature In order to correlate a specific duty cycle of the PWM signal or a corresponding duty cycle parameter, respectively PWM value, with a particular measurement value of quantity T, a device-specific correlation rule is stored in digital signal-processing unit 13. The correlation rule describes, in the form of a linear interpolation, a linear relationship between the respective current measurement value MV_NOW of sensor signal T_ASIC and the associated duty cycle parameter PWM_OUT_NOW. The corresponding relationships are illustrated in a highly schematic form in FIGS. 2a and 2b, FIG. 2a showing the second functional block 13.2 of digital signal-processing unit 13 and FIG. 2b showing a detailed diagram illustrating the linear interpolation performed.

Based on the example specifically described for temperature measurement, the linear interpolation will now be explained with the aid of FIG. 2b.

The values MV_OUT_MIN and MV_OUT_MAX plotted along the y-axis represent, in increments of 1/100° C., the lower and upper thresholds of the temperature T to be output. Thus, for this example, it holds that:

MV_OUT_MIN=−4,000(=T_OUT_MIN*100)

MV_OUT_MAX=6,000(=T_OUT_MAX*100)

Thus, at the minimum temperature T_OUT_MIN=−40° C., the minimum voltage OUT_MIN=0 V is output for the analog voltage signal $U_{OUT}$, and at the maximum temperature T_OUT_MAX=60° C., the maximum voltage OUT_MAX=10.000 V is output.

The values PWM_OUT_MIN and PWM_OUT_MAX; i.e. the minimum and maximum duty cycle parameter thresholds thus constitute device-specific correction parameters which, upon completion of the calibration mode, are stored for the respective sensor device in a memory unit 14 in ASIC 10, either at the factory or by the customer. These values are used in the measurement mode to correct possible component variations and remain permanently stored in the preferably non-volatile memory unit 14 over the lifetime of the sensor device.

In addition to the device-specific correction parameters PWM_OUT_MIN, PWM_OUT_MAX, the values MV_OUT_MIN, MV_OUT_MAX; i.e., the lower and upper sensor threshold measurement values of the temperature T to be output, which limit the desired measurement range, may also be stored in memory unit 14. If necessary, the measurement range can still be suitably changed and adapted to the specific measurement requirements at a later time by changing the respective sensor threshold measurement values.

For a current measurement value MV_NOW of the respective sensor, the corresponding duty cycle parameter or PWM value PWM_OUT_NOW of the associated PWM signal is then obtained by a linear interpolation between the two thresholds PWM_OUT_MIN, PWM_OUT_MAX along the solid line in FIG. 2b. This linear interpolation is stored as a device-specific conversion rule in digital signal-processing unit 13. The following relationship holds:

$$\text{PWM\_OUT\_NOW} = k_{PWM} \cdot \text{MV\_OUT\_NOW} + d_{PWM} \quad \text{(equation 4)}$$

where:

PWM_OUT_NOW := duty cycle parameter of the PWM signal $$k_{PWM} := \frac{(PWM_{OUT_{MAX}} - PWM_{OUT_{MIN}})}{(MV_{OUT_{MAX}} - MV_{OUT_{MIN}})}$$

$$d_{PWM} = \text{PWM\_OUT\_MIN} - \text{MV\_OUT\_MIN} * k_{PWM}$$

In the specific example, the following results for the two variables $k_{PWM}$ and $d_{PWM}$ with the values indicated above:

$$k_{PWM} = \frac{(51,898 - 7453)}{(6,000 + 4,000)} = 4.4444$$

$$d_{PWM} = 7453 + 4,000 * 4.444444 = 25,230.78 \cong 25,231$$

For example, if the currently measured temperature value is 25.00° C., the associated PWM value PWM_OUT_NOW of the PWM signal PWM to be generated in functional block 13.2 can be determined as follows:

MV_NOW=T_AKT*100=25.00*100=2,500

PWM_OUT_NOW=MV_NOW*$k_{PWM}$+$d_{PWM}$=2,500*4.4444+25,231=36,342,25≅36,342

In the case of a PWM value PWM_OUT_NOW=36,342 selected in this way, equation 1 a) ensures that the analog voltage signal $U_{OUT}$ at the output has exactly a value of 6.49995 V. The difference from 6,5000 V results from the quantization of the value for PWM_OUT_NOW from a real number to a 16-bit number.

After the required PWM value PWM_OUT_NOW has been determined by the performed linear interpolation in second functional block 13.2 of digital signal-processing unit 13, the rectangular PWM signal can then be generated with this value by way of PWM comparator stage 13.2c, PWM clock generator 13.2a and PWM counter 13.2b and transferred to amplifier unit 20. During this process, PWM counter 13.2b is supplied with a clock signal of PWM clock generator 13.2a and counts, for example, upward with each rising clock signal edge. As long as the up counting continues, PWM comparator stage 13.2a outputs a HIGH signal (VDD) at the output. If the value PWM_OUT is reached in this process, PWM comparator stage 13.2a switches the output signal from HIGH (VDD) to LOW (0 V). In the event of a counter overflow; i.e., for example, when the counter value rolls over from 65,535 to zero, a HIGH signal (VDD) is output at the output of PWM comparator stage 13.2a.

In this way, a device-specific PWM value PWM_OUT_NOW is thus set for a particular measurement value MV_NOW as a function of the existing component tolerances. This means that for a specific, calibrated sensor device, a device-specific relationship between the measurement value to be output and the PWM value is predefined, which is used in the measurement mode to generate the analog output signal $U_{OUT}$. Due to the device-specific correction parameters PWM_OUT_MIN, PWM_OUT_MAX permanently stored in memory unit 14, this can be taken into account during the entire lifetime of the respective sensor device. Thus, the measures according to the present invention make it possible to reliably calibrate the entire sensor device formed by ASIC 10 and amplifier unit 20 and to compensate for possible component variations both in ASIC 10 and in amplifier unit 20. The sensor device does not need to be exposed to a changed temperature in order to perform the calibration, which means that the calibration mode can be performed without changing the temperature of the sensor device.

In addition to the exemplary embodiments described above, other embodiments are of course possible within the scope of the present invention.

It is possible, for example, to build a sensor device according to the present invention, where an analog current signal is generated at the output from the PWM signal by way of the amplifier unit, etc.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A sensor device comprising:
   at least one sensor configured to measure a variable physical quantity and provide a raw sensor signal at an output of the at least one sensor;
   a digital signal processor configured to preprocess the raw sensor signal output by the at least one sensor into a sensor signal and to further process the sensor signal into a pulse-width-modulated output signal having a duty cycle that is dependent on the measured quantity using a plurality of device-specific correction parameters stored in a memory to convert the sensor signal into the pulse-width modulated output signal, wherein the device-specific correction parameters stored in the memory include at least a minimum duty cycle parameter threshold and a maximum duty cycle parameter threshold; and
   an amplifier configured to convert the pulse-width modulated output signal into an analog voltage or current signal.

2. The sensor device as recited in claim 1, wherein the digital signal processor has stored therein a device-specific conversion rule which describes a linear relationship between a measurement value of the sensor signal and a duty cycle parameter of the pulse-width modulated output signal.

3. The sensor device as recited in claim 1, wherein the memory further has stored therein a minimum sensor threshold measurement value and a maximum sensor threshold measurement value, which limit the measurement range of the at least one sensor.

4. The sensor device as recited in claim 1, wherein the digital signal processor has stored therein a device-specific conversion rule with the following relationship:

$$\text{PWM\_OUT\_NOW} = \text{MV\_NOW} \cdot k_{PWM} + d_{PWM},$$

where:

PWM_OUT_NOW := a duty cycle parameter of the *PWM* signal;

MV_NOW := a value measured by the sensor;

$$k_{PWM} := \frac{(\text{PWM\_OUT\_MAX} - \text{PWM\_OUT\_MIN})}{(\text{MV\_OUT\_MAX} - \text{MV\_OUT\_MIN})};$$

$$d_{PWM} := \text{PWM\_OUT\_MIN} - \text{MV\_OUT\_MIN} \cdot k_{PWM};$$

PWM_OUT_MAX := the maximum duty cycle parameter threshold;

PWM_OUT_MIN := the minimum duty cycle parameter threshold;

MV_OUT_MAX := a maximum sensor threshold measurement value; and

MV_OUT_MIN := a minimum sensor threshold measurement value.

5. The sensor device as recited in claim 1, wherein the at least one sensor, the digital signal processor and the memory are disposed together in an application-specific integrated circuit (ASIC), and the amplifier is configured separately from the ASIC.

6. The sensor device as recited in claim 5, wherein the memory is non-volatile.

7. The sensor device as recited in claim 1, wherein the amplifier is configured as an amplifier circuit with a low-pass filter.

8. The sensor device as recited in claim 1, wherein the at least one sensor is two sensors including a first sensor configured as a temperature sensor and a second sensor configured as a humidity sensor.

9. A method for operating a sensor device in a measurement mode and in a calibration mode, the method comprising:
   operating the sensor device in the measurement mode including the steps of:
      measuring, by at least one sensor, a variable physical quantity and providing, by the at least one sensor at an output of the at least one sensor, a raw sensor signal,
      preprocessing, by a digital signal processor, the raw sensor signal output by the at least one sensor into a sensor signal and converting, by the digital signal processor, the sensor signal into a pulse-width-modulated output signal having a duty cycle that is dependent on the measured quantity, and
      converting, by an amplifier, the pulse-width modulated output signal into an analog voltage or current signal; and operating the sensor device in the calibration mode preceding the measurement mode including the step of storing a plurality of device-specific correction parameters in a memory, wherein, in the calibration mode, the device-specific correction parameters stored in the memory include at least a minimum duty cycle parameter threshold and a maximum duty cycle parameter threshold, wherein the device-specific correction parameters are used by the signal processor in the measurement mode to convert the sensor signal into the pulse-width modulated output signal.

10. The method as recited in claim 9, wherein, in the calibration mode, a device-specific conversion rule which describes a linear relationship between a measurement value of the sensor signal and a duty cycle parameter of the pulse-width modulated output signal is stored in the digital signal processor.

11. The method as recited in claim 9, wherein a minimum sensor threshold measurement value and a maximum sensor threshold measurement value, which limit the measurement range of the at least one sensor, are additionally stored in the memory.

12. The method as recited in claim 9, wherein the digital signal processor has stored therein a device-specific conversion rule with the following relationship:

$$PWM\_OUT\_NOW = MV\_NOW \cdot k_{PWM} + d_{PWM},$$

where:

$PWM\_OUT\_NOW :=$ a duty cycle parameter of the $PWM$ signal;

$MV\_NOW :=$ a measurement value of the sensor signal;

$$k_{PWM} := \frac{(PWM\_OUT\_MAX - PWM\_OUT\_MIN)}{(MV\_OUT\_MAX - MV\_OUT\_MIN)};$$

$d_{PWM} := PWM\_OUT\_MIN - MV\_OUT\_MIN \cdot k_{PWM};$ $PWM\_OUT\_MAX :=$ the maximum duty cycle parameter threshold;

$PWM\_OUT\_MIN :=$ the minimum duty cycle parameter threshold;

$MV\_OUT\_MAX :=$ a maximum sensor threshold measurement value; and $MV\_OUT\_MIN :=$ a minimum sensor threshold measurement value.

13. The method as recited in claim 9, wherein the calibration mode is performed without changing a temperature of the sensor device.

* * * * *